United States Patent
Nakashima et al.

(10) Patent No.: US 6,893,726 B2
(45) Date of Patent: May 17, 2005

(54) SUBSTRATE COATED WITH SILICA-CONTAINING FILM WITH LOW-DIELECTRIC CONSTANT

(75) Inventors: Akira Nakashima, Kitakyushu (JP); Michio Komatsu, Kitakyushu (JP)

(73) Assignee: Catalysts & Chemicals Industries Co., Ltd. (JP)

( * ) Notice: Subject to any disclaimer, the term of this patent is extended or adjusted under 35 U.S.C. 154(b) by 0 days.

(21) Appl. No.: 10/649,575

(22) Filed: Aug. 26, 2003

(65) Prior Publication Data

US 2004/0038047 A1 Feb. 26, 2004

Related U.S. Application Data

(62) Division of application No. 09/530,437, filed as application No. PCT/JP99/04050 on Jul. 28, 1999, now Pat. No. 6,639,015.

(30) Foreign Application Priority Data

Sep. 1, 1998 (JP) .............................. 10-247430
Apr. 2, 1999 (JP) ............................... 11-96367

(51) Int. Cl.$^7$ ........................................ H01L 21/3105
(52) U.S. Cl. ............... 428/447; 257/E21.242; 257/E21.261
(58) Field of Search .................. 428/447; 257/E21.242, 257/E21.261

(56) References Cited

U.S. PATENT DOCUMENTS

| | | |
|---|---|---|
| 4,214,057 A | 7/1980 | Ishihara et al. |
| 4,478,909 A | 10/1984 | Taniguchi et al. |
| 4,615,947 A | 10/1986 | Goossens |
| 5,503,935 A | 4/1996 | Patel |
| 6,001,522 A | 12/1999 | Woo et al. |
| 6,204,202 B1 | 3/2001 | Leung et al. |
| 6,261,357 B1 | 7/2001 | Egami et al. |
| 6,451,436 B1 * | 9/2002 | Komatsu et al. ............ 428/447 |

FOREIGN PATENT DOCUMENTS

| | | |
|---|---|---|
| EP | 0 145 308 A2 | 6/1985 |
| EP | 0 767 467 A2 | 4/1997 |
| EP | 0 890 623 A1 | 1/1999 |
| WO | 97/35939 * | 2/1997 |

* cited by examiner

*Primary Examiner*—Margaret G. Moore
(74) *Attorney, Agent, or Firm*—Webb Ziesenheim Logsdon Orkin & Hanson, P.C.

(57) ABSTRACT

A coating liquid for forming a silica-containing film with a low-dielectric constant which enables formation of low-density film having a dielectric constant as low as 3 or less and having excellent resistance to oxygen plasma and process adaptation but also in the adhesion to a substrate and film strength. A substrate coated with the silica-containing film having the above characteristics, obtained by the use of the above coating liquid. The coating liquid for forming a silica-containing film with a low-dielectric constant comprises a polymer composition mainly constituted by a polysiloxane and a readily decomposable resin, said polysiloxane being a reaction product between fine particles of silica and a hydrolyzate of at least one alkoxysilane represented by the following formula (I): $X_nSi(OR)_{4-n}$, wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; and n is an integer of 0 to 3.

10 Claims, No Drawings

SUBSTRATE COATED WITH SILICA-CONTAINING FILM WITH LOW-DIELECTRIC CONSTANT

CROSS-REFERENCE TO RELATED APPLICATIONS

This application is a division of application Ser. No. 09/530,437 filed Apr. 28, 2000, now U.S. Pat. No. 6,639,015 issued Oct. 28, 2003, which is a national phase filing of International Application No. PCT/JP99/04050 filed Jul. 28, 1999.

BACKGROUND OF THE INVENTION

1. Field of the Invention

The present invention relates to a coating liquid for forming a silica-containing film with a low-dielectric constant which enables the formation of a low-density film having a dielectric constant as low as 3 or less and being excellent in resistance to oxygen plasma and also in process adaptation such as etching performance, and relates to a substrate coated with a silica-containing film which exhibits the above properties.

2. Description of Related Art

In semiconductor devices with a multi-level interconnect integrated circuit at design levels of 0.25 micron or less, metal wiring impedance attributed to electrostatic induction is increased because of a narrow spacing between metal wiring layers required for the advanced integration of such semiconductor devices. Thus, a delay in response speed and an increase in power consumption become problems to be resolved. For coping with this, it is necessary to minimize the dielectric constant of an interconnect insulating film disposed between a semiconductor substrate and a metal wiring layer such as an aluminum wiring layer or between metal wiring layers.

The interconnect insulating film disposed for the above purpose is generally formed on a substrate by a vapor phase growth method such as CVD (chemical vapor deposition) method or by a coating method using a conventional coating liquid.

However, it is believed that the dielectric constant of silica-containing film obtained by vapor phase growth methods such as the CVD method is 3.5 (in the case of a fluorine-doped silica film) or higher, and that forming a silica-containing film having a dielectric constant of lower than 3 is difficult. On the other hand, the coating film containing a polyaryl resin, a fluorinated polyimide resin or a fluoro-resin, which is formed on a substrate by the CVD method or the coating method, exhibits a dielectric constant of about 2. However, these films have drawbacks in that not only their adhesion to a substrate surface or to a resist material employed in its processing is poor, but also the resistance to chemicals and oxygen plasma is inferior.

The conventional coating liquid for forming a silica-containing film, which comprises a partial hydrolyzate of alkoxysilane, enables the obtaining of a coating film with a dielectric constant of about 2.5. However, the coating film has a drawback in that its adhesion to a substrate surface is poor.

The inventors of the present invention have found that the silica-containing film obtained from a coating liquid comprising a reaction product between fine particles of silica and a halogenated silane or a hydrolyzate thereof exhibits a dielectric constant as low as 3 or less and is excellent in not only the adhesion to a substrate surface, mechanical strength and chemical resistance such as alkali resistance, but also in crack resistance. Based on such findings, a patent application was filed and published as Japanese Patent Laid-Open Publication No. 9(1997)-315812.

In order to obtain an insulating film with a low-dielectric constant, it was proposed to form a porous low-density film so as to decrease the dielectric constant. For example, Japanese Patent Laid-Open Publication No. 8(1996)-330300 discloses a process for forming an insulating film with a dielectric constant of not more than 3. According to the invention disclosed in this publication, the insulating film having a low-dielectric constant is formed by applying a coating liquid dissolved therein a gas-generating substance of organic components such as 5-naphthoquinonediazidosulfonic esters, 4-naphthoquinonediazidosulfonic esters, quinonediazides, diazonium salts, azide compounds, maleic acid derivatives, acetoacetic acid derivatives, diazomeldrum derivatives, t-butoxycarbonic ester derivatives and polybutenesulfone derivatives onto a substrate by an SOG (spinning on glass) method, and then heating the thus-coated film or irradiating it with radiation to render the film porous.

However, it is known that although an insulating film having a dielectric constant of not more than 3 can be obtained from the coating liquid containing such a gas-generating substance, the adhesion of the resulting film to a substrate and film strength are not always satisfactory.

As a result of various studies made by the inventors of the present invention, it was found that rendering the coating film too porous to attain a low-dielectric constant will cause deterioration of the film quality attributed to the irradiation of oxygen plasma in the process of plasma etching or peeling of a resist material, and such a deterioration tendency is conspicuous particularly in a porous film (including a porous silica-containing film) having pores or voids of a relatively large size.

Under such circumstances as described above, there has been a strong requirement for development of a coating liquid for forming a silica-containing film with a low-dielectric constant which enables the formation of a low-density insulating film having a dielectric constant as low as 3 or less and being excellent not only in resistance to oxygen plasma and in process adaptation such as etching performance, but also in the adhesion to a substrate and film strength.

SUMMARY OF THE INVENTION

The present invention has been accomplished with a view to solving the above problems of the prior art. Accordingly, the present invention provides a coating liquid for forming a silica-containing film which enables forming a low-density insulating film having a dielectric constant as low as 3 or less and being excellent not only in resistance to oxygen plasma and process adaptation such as etching performance, but also in the adhesion to a substrate and film strength. In addition, the present invention provides a substrate furnished with a silica-containing film having the above properties.

The coating liquid for forming a silica-containing film with a low-dielectric constant according to the present invention comprises a polymer composition mainly constituted by (i) a polysiloxane and (ii) a readily decomposable resin, said polysiloxane being a product of reaction between fine particles of silica and a hydrolyzate of at least one alkoxysilane represented by the following formula (I):

$$X_nSi(OR)_{4-n} \quad (I),$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; and n is an integer of 0 to 3.

The polymer composition is preferably an interpenetrated polymer composition in which the polysiloxane and the readily decomposable resin are entangled in each other on the molecular chain level.

The fine particles of silica are preferably obtained by hydrolyzing at least one alkoxysilane represented by the above formula (I), optionally followed by aging.

The polysiloxane is preferably obtained by allowing a hydrolyzate of at least one alkoxysilane represented by the above formula (I) to react with the surfaces of the fine particles of silica.

The readily decomposable resin is preferably a resin which is decomposed or vaporized by heating at a temperature of not higher than 500° C. or by irradiating with ultraviolet radiation, infrared radiation, electron beam, X-ray or oxygen plasma. Moreover, the readily decomposable resin preferably has a number-average molecular weight of 500 to 50,000 based on polystyrene.

The polymer composition is preferably obtained by performing a catalytic hydrolysis reaction of alkoxysilane in a solution comprising:

(a) the fine particles of silica having an average particle diameter of 5 to 50 nm, (b) at least one alkoxysilane represented by the above formula (I), and (c) the readily decomposable resin dissolved in an organic solvent being insoluble in water, with addition thereto of water and an acid catalyst, or an aqueous solution containing the acid catalyst.

In the polymer composition, the weight ratio (A/B) of the polysiloxane (A), in terms of $SiO_2$, to the readily decomposable resin (B) is preferably in the range of 95/5 to 50/50.

The mixing ratio (A/B) by weight, in terms of $SiO_2$, of the fine particles of silica (A) to the alkoxysilane (B) represented by the above formula (I), both being used for preparing the polysiloxane, is preferably in the range of 1/99 to 10/90.

The substrate coated with a silica-containing film with a low-dielectric constant according to the present invention is a low-density film formed by:

applying the above coating liquid for forming a silica-containing film with a low-dielectric constant onto a substrate, heating the thus-coated film, and then decomposing or vaporizing the readily decomposable resin contained in the film by a thermal treatment at a temperature of not higher than 500° C. or by an irradiation with ultraviolet radiation, infrared radiation, electron beam, X-ray or oxygen plasma.

In the substrate coated with a silica-containing film with a low-dielectric constant, the average diameter of pores or voids present in the low-density film formed by the above method is preferable to be not more than 5 nm.

The coating liquids for forming a silica-containing film with a low-dielectric constant and the substrate coated with such a film according to the present invention are described below in detail.

Coating Liquid for Forming a Silica-containing Film with a Low-dielectric Constant The coating liquid for forming a silica-containing film with a low-dielectric constant according to the present invention comprises a polymer composition, preferably an interpenetrated polymer composition, which is mainly constituted by (i) a polysiloxane and (ii) a readily decomposable resin.

Polysiloxane

In the present invention, polysiloxane can be obtained as a reaction product between fine particles of silica and a hydrolyzate of at least one alkoxysilane represented by the following formula (I):

$$X_nSi(OR)_{4-n} \quad (I),$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; and n is an integer of 0 to 3.

Fine Particles of Silica

The fine particles of silica can be obtained by hydrolyzing at least one alkoxysilane represented by the above formula (I) and polycondensing the hydrolyzate of the alkoxysilane under the presence of water, an organic solvent and ammonia. For preparing the fine particles of silica, a process described in the aforesaid Japanese Patent Laid-Open Publication No. 9(1997)-315812 or other processes hitherto known is employable. Examples of the suitable alkoxysilanes represented by the above formula (I) include tetramethoxysilane, tetraethoxysilane, tetraisopropoxysilane, tetrabutoxysilane, tetraoctylsilane, methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane and trifluoromethyltriethoxysilane.

The organic solvent is selected from among, for example, alcohols such as methanol, ethanol, propanol and butanol, ketones such as methylethylketone and methylisobutylketone, glycol ethers such as methylcellosolve, ethylcellosolve and propyleneglycolmonopropylether, glycols such as ethyleneglycol, propyleneglycol and hexyleneglycol and esters such as methylacetate, ethylacetate, methyllactate and ethyllactate.

A method for preparing the fine particles of silica is described below more concretely.

Specifically, the method for producing the fine particles of silica may comprise a mixing stage at which at least one alkoxysilane and aqueous ammonia are added to a solution essentially composed of water and alcohol under agitation, so as to effect a hydrolysis reaction of the alkoxysilane.

In the solution, it is preferable that water, which is necessary for the hydrolysis reaction of alkoxysilane, is contained in an amount of 0.5 to 50 mol, more preferably 1 to 25 mol, per mol of the Si—OR group which is a constituent part of the alkoxysilane.

On the other hand, ammonia, which functions as a catalyst, is preferably added in an amount of 0.01 to 1 mol, more preferably 0.05 to 0.8 mol, per mol of the alkoxysilane in terms of $SiO_2$.

The hydrolysis reaction of alkoxysilane is preferably performed in a heat-resistant and pressure-resistant vessel such as an autoclave at a temperature of not lower than 180° C., especially 200° C. or higher. The reaction products may be aged at the same temperature as that for the hydrolysis reaction or at a higher temperature than that for it. The higher the reaction temperature and/or aging temperature, the further the polycondensation of the hydrolyzate of alkoxysilane is promoted and then the fine particles of silica are more densified at the inside thereof. When the hydrolysis reaction and/or aging are carried out at such temperatures, the fine particles of silica are highly densified, whereby the moisture adsorptivity of the fine particles per se is lowered and the amount of functional groups remaining on the particle surface is reduced.

The formation and growth of fine particles of silica can also be carried out by adding a high-boiling-point solvent such as ethyleneglycol to, for example, the above solution containing water and alcohol under agitation, and then performing the hydrolysis reaction of alkoxysilane. If such a high-boiling-point solvent is present in the solution at the time at which the alkoxysilane is hydrolyzed, a transesterification reaction of alkoxy group will occur. As a result, the high-boiling-point solvent is captured in the internal parts of fine particles of silica, thereby obtaining fine particles of porous low-density silica.

Moreoever, in the present invention, silica-sol obtained by subjecting an alkali metal silicate or the like to an ion exchange stage or a hydrolysis stage may be used as the fine particles of silica for the present invention. In addition, fine particles of porous zeolite obtained by removing aluminum from a zeolite mainly composed of aluminosilicate can also be used for the present invention.

The average particle diameter of the fine particles of silica is preferably in the range of 5 to 50 nm, more preferably 10 to 50 nm. As long as the average particle diameter is in these ranges, the fine particles of silica may be either those of uniform particle size or a mixture of at least two types of fine particles having different particle sizes. The shape of the fine particles of silica may be either spherical or non-spherical. When the average particle diameter is less than 5 nm, it is difficult for the coating liquid to have good stability with time. On the other hand, when the average particle diameter is more than 50 nm, problems are likely to occur at the time of micro-processing at a microphotolithography stage.

Preparation of Polysiloxane

The polysiloxane for use in the present invention can be obtained by mixing the fine particles of silica and at least one alkoxysilane represented by the following formula (I) in an organic solvent and then performing a hydrolysis reaction of the alkoxysilane under the presence of water and a catalyst:

$$X_nSi(OR)_{4-n} \quad (I),$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; and n is an integer of 0 to 3.

Examples of the alkoxysilanes represented by the above formula (I) include the same alkoxysilanes as those employed in the preparation of the fine particles of silica. The alkoxysilane for use in this stage may be the same as or different from that employed in the preparation of fine particles of silica.

As for the organic solvents, not only the same organic solvents as employed in the preparation of the fine particles of silica but also hydrocarbons such as hexane, cyclohexane and octane, and aromatic hydrocarbons such as toluene, xylene and mesitylene can be used.

As for the catalysts, inorganic acids such as hydrochloric acid, nitric acid and sulfuric acid, and organic acids such as acetic acid, oxalic acid and toluenesulfonic acid, and compounds exhibiting acidity in an aqueous solution such as metallic soap can be used.

The catalyst is preferably added in an amount of 0.001 to 1 mol, per mol of the alkoxysilane.

In addition, water, which is necessary for the hydrolysis reaction of alkoxysilane, is preferably added in an amount of 0.1 to 5 mol, more preferably 0.1 to 2 mol, per mol of the Si—OR group which is a constituent part of the alkoxysilane.

The mixing ratio (A/B) by weight, in terms of $SiO_2$, of the fine particles of silica (A) to the alkoxysilane (B) represented by the above formula (I), both being used for preparing the polysiloxane, is preferably in the range of 1/99 to 10/90, more preferably 1/99 to 5/95. When the mixing ratio (A/B) is less than 1/99, the hydrolysis reaction of alkoxysilane proceeds not only on the surfaces of the fine particles of silica but also in bulk organic solvent and at locations beyond the surfaces thereof, and as a result, the resulting coating liquid containing polysiloxane and an extra hydrolyzate of alkoxysilane may exhibit poor stability with time. When the mixing ratio (A/B) is more than 10/90, the bonding strength between the particles of polysiloxane in the silica-containing film coated on a substrate is lowered because of a lack of reaction between the hydrolyzate of alkoxysilane and the surfaces of the fine particles of silica, and the film strength tends to be insufficient.

Although the reaction conditions at this stage are not limited, it is preferable that the reaction be performed under agitation at a temperature of not higher than 100° C., more preferably 80° C. or lower, for a period of 0.5 to 5 hours, more preferably 0.5 to 3 hours.

Under the above conditions, a polysiloxane of which the hydrolyzate of alkoxysilane has bonded to the surfaces of the fine particles of silica is obtained.

However, the process for preparing such a polysiloxane is not limited to those as described above. For example, a polysiloxane prepared by the process described in Japanese Patent Laid-open Publication No. 9(1997)-315812 is also employable.

The polymer composition according to the present invention can be directly prepared by performing a catalytic hydrolysis reaction in a solution comprising the fine particles of silica, the alkoxysilane represented by the above formula (I) and the readily decomposable resin, without subjecting to the stage of preparation for the polysiloxane, detail of which is as described below.

Readily Decomposable Resin

The readily decomposable resin for use in the present invention has a property of being decomposed or vaporized by heating at a temperature of not higher than 500° C., or by an irradiation with ultraviolet radiation, infrared radiation, electron beam, X-ray or oxygen plasma. Examples of the suitable readily decomposable resins include cellulose resins, polyamide resins, polyester resins, acrylic resins, polyether resins, polyolefin resins, polyol resins and epoxy resins.

The number-average molecular weight of these readily decomposable resins is preferably in the range of 500 to 50,000, more preferably 5,000 to 30,000 based on polystyrene. When the number-average molecular weight of the resin is more than 50,000, pores or voids with a relatively large size are likely to be formed in the silica-containing film coated on a substrate at the time at which the resin is decomposed or vaporized. As a result, poor adhesion of the resulting film to a substrate, lowering of the film strength, soaking of the etching gas components and deterioration of the film quality attributed to the irradiation of oxygen plasma are likely to occur when such a resin is employed. When the number-average molecular weight of the resin is less than 500, a low-density film cannot be formed, and it becomes difficult to lower the dielectric constant of the resulting silica-containing film.

Polymer Composition

The polymer composition for use in the present invention is a composition mainly constituted by (i) a polysiloxane and (ii) a readily decomposable resin.

The polymer composition is preferably an interpenetrated polymer composition in which the polysiloxane and the readily decomposable resin are homogeneously entangled in each other on the molecular chain level.

In the polymer composition, the weight ratio (A/B) of the polysiloxane (A), in terms of $SiO_2$, to the readily decomposable resin (B) is preferably in the range of 95/5 to 50/50, more preferably 90/10 to 50/50. When the coating liquid containing such components at the weight ratio (A/B) of more than 95/5 is used, a silica-containing film with a dielectric constant of lower than 3 is not always obtainable, and also when the weight ratio (A/B) is less than 50/50, the film strength of the silica-containing film is decreased to an insufficient level.

The polymer composition preferably has a number-average molecular weight of 500 to 50,000, more preferably 1,000 to 30,000 based on polystyrene.

The polymer composition can be prepared by mixing (i) the polysiloxane with (ii) the readily decomposable resin dissolved in any organic solvents such as ketones, ethers, esters, hydrocarbons and aromatic hydrocarbons. Prior to preparing such a mixture, at least one alkoxysilane represented by the above formula (I) may be optionally added to the organic solvent.

The thus-obtained solution containing a mixture of the polysiloxane and the readily decomposable resin is preferably agitated at a temperature of 20 to 60° C. for a period of 1 to 6 hours under the presence of a small amount of water and an acid catalyst. By agitating it at such a temperature, a secondary hydrolysis reaction of polysiloxane proceeds in the skeleton of the readily decomposable resin, thereby obtaining an interpenetrated polymer composition in which the polysiloxane and the readily decomposable resin are homogeneously entangled. However, there is a possibility that depending on the sort of the readily decomposable resins and other conditions to be employed, such a homogeneously entangled composition may be unobtainable.

The polymer composition can be directly prepared by performing a catalytic hydrolysis reaction in a solution comprising the fine particles of silica, the alkoxysilane represented by the above formula (I) and the readily decomposable resin dissolved in an organic solvent which is insoluble in water. According to this method, the interpenetrated polymer composition can be easily prepared.

Specifically, such a polymer composition can be directly obtained by performing a catalytic hydrolysis reaction of alkoxysilane in a solution comprising:
(a) the fine particles of silica having an average particle diameter of 5 to 50 nm,
(b) at least one alkoxysilane represented by the above formula (I), and
(c) the readily decomposable resin dissolved in an organic solvent being insoluble in water,
with addition thereto of water and an acid catalyst, or an aqueous solution containing the acid catalyst.

As described above, the mixing ratio (A/B) by weight, in terms of $SiO_2$, of the fine particles of silica (A) to the alkoxysilane (B) represented by the above formula (I) is preferably in the range of 1/99 to 10/90, more preferably 1/99 to 5/95. Furthermore, it is preferable that the readily decomposable resin is mixed so that the aforesaid weight ratio of the polysiloxane to the readily decomposable resin can be attained.

More specifically, the above method for preparing the interpenetrated polymer composition uses a solution comprising an organic solvent and water to be separated into two phases, and is operated by performing a hydrolysis reaction of alkoxysilane represented by the above formula (I) at the interface between the organic solvent and water, and then extracting the hydrolyzate of the alkoxysilane into the phase of the organic solvent dissolved the readily decomposable resin therein.

In this method, the hydrolysis reaction of alkoxysilane will proceed efficiently on the surfaces of the fine particles of silica dispersed into the phase of organic solvent, and the thus-produced polysiloxane will be entangled with the readily decomposable resin dissolved in the organic solvent.

The fine particles of silica prepared in the above stage may be used directly without any purification. However, the fine particles of silica are preferably purified by ultrafiltration, distillation and the like, before they are used for preparation of the polysiloxane or for direct preparation of the polymer composition.

As for the organic solvents to be used for dissolving the readily decomposable resin, any solvent may be employable without any specific limitation as long as they have a property of being insoluble in water. Examples of the organic solvents include ketones such as methylethylketone and methylisobutylketone, ethers such as ethylether and butylether, esters such as methylacetate, ethylacetate, methyllactate and ethyllactate, hydrocarbons such as hexane, cyclohexane and octane, and aromatic hydrocarbons such as toluene, xylene and mesitylene. Of these solvents, ketones such as methylisobutylketone are preferably employed from the viewpoints of dispersibility of the fine particles of silica and solubility of the readily decomposable resin.

The organic solvent is used in an amount sufficient to completely dissolve the readily decomposable resin, although its amount varies depending on the properties of the solvent and the readily decomposable resin to be employed. For example, when acrylic resin with an oxidative decomposability is used as the readily decomposable resin and methylisobutylketone is used as the organic solvent, the methylisobutylketone (A) is preferably mixed with the acrylic resin (B) at the weight ratio (A/B) of 1 to 10.

The organic solvent may be heated up to a temperature of not higher than its boiling point to make dissolution of the readily decomposable resin easy. However, in such a case, it may be necessary for its use to cool it down to the temperature required for the hydrolysis reaction of alkoxysilane as described above.

The fine particles of silica are preferably used in a monodisperse state in an organic solvent such as methylisobutylketone or methylethylketone.

Although the alkoxysilane can be used as it is, it is preferably used after having been dissolved in an organic solvent such as methylisobutylketone.

The organic solvent to be used for dispersing the fine particles of silica, or the organic solvent to be used for dissolving the alkoxysilane or the readily decomposable resin may be the same as or different from each of them, as far as there is no phase separation when they are mixed.

Water, which is necessary for the catalytic hydrolysis reaction, is preferably added at the weight ratio (A/B) of 0.1 to 2, more preferably 0.5 to 1.5, to the mixture (B) of the fine particles of silica, the alkoxysilane represented by the above formula (I), the readily decomposable resin and the organic solvent contained in the solution. When water is added at the weight ratio of less than 0.1, the catalytic hydrolysis reaction becomes extremely slow, and when it is added at the weight ratio of more than 2, the catalytic hydrolysis reaction proceeds so rapidly that the resulting coating liquid tends to have poor stability with time.

As for the catalyst, an acid catalyst, which can exhibit acidity in an aqueous solution, is employed. Examples of the acid catalysts include inorganic acids such as hydrochloric acid, nitric acid and sulfuric acid, organic acids such as acetic acid, oxalic acid and toluenesulfonic acid, and metallic soap exhibiting acidity in an aqueous solution. The amount of the acid catalyst to be used varies depending on the sort of the catalyst. For example, the inorganic acid catalyst (A) is preferably added at the weight ratio (A/B) of 0.0001 to 0.01, more preferably 0.001 to 0.01, to the mixture (B) of the fine particles of silica, the alkoxysilane represented by the above formula (I), the readily decomposable resin and the organic solvent contained in the solution. When the inorganic acid catalyst is added at the weight ratio of less than 0.0001, the catalytic hydrolysis reaction becomes extremely slow, and when it is added at the weight ratio of more than 0.01, the hydrolysis reaction proceeds so rapidly that the resulting coating liquid tends to have poor stability with time.

Although water and the acid catalyst can be added separately under the above conditions, it is preferable to use for the addition an aqueous solution containing the acid catalyst, which is a mixture of them. If the temperature of the aqueous solution is raised by a heat of reaction between water and the acid catalyst, it may be necessary for its use to cool it down to the temperature required for the catalytic hydrolysis reaction as described below.

The catalytic hydrolysis reaction will be performed by adding water and the acid catalyst or an aqueous solution containing acid catalyst to a solution comprising the fine particles of silica, the alkoxysilane represented by the above formula (I) and the readily decomposable resin dissolved in an organic solvent, and by agitating the solution at a temperature of not more than 80° C., more preferably 50° C. or below, for a period of 0.5 to 5 hours, more preferably 0.5 to 3 hours. Although water and the acid catalyst or the aqueous solution containing the acid catalyst may be added to the solution little by little over the above period of time, the whole amount thereof is preferably added at once in the beginning.

By the catalytic hydrolysis reaction described above, an interpenetrated polymer composition mainly constituted by (i) the polysiloxane of which the hydrolyzate of alkoxysilane is bonded to the surfaces of the fine particles of silica and (ii) the readily decomposable resin, is prepared.

Preparation of Coating Liquid

The coating liquid for forming a silica-containing film with a low-dielectric constant according to the present invention comprises a polymer composition, preferably an interpenetrated polymer composition, at a concentration of preferably 5 to 30% by weight, more preferably 10 to 25% by weight, in the coating liquid mainly consisting of the polymer composition and organic solvent.

As for the organic solvents, any of organic solvents such as ketones, ethers, esters, hydrocarbons and aromatic hydrocarbons as described above is employable without any specific limitation.

In the present invention, the solution comprising a polymer composition or an interpenetrated polymer composition together with other components, which has been obtained by the above process, may be used directly as the coating liquid. However, the coating liquid is preferably prepared by:

(a) separating the organic phase from the above solution which is in two phases consisting of an organic phase containing the organic solvent and the polymer composition or the interpenetrated polymer composition, and a water phase containing the alcohol as a by-product of the hydrolysis reaction and the acid catalyst, (b) replacing the organic solvent contained in the organic phase with an organic solvent such as methylisobutylketone by means of a rotary evaporator or the like, by which the alcohol, water and acid catalyst remaining in the organic phase can also be removed, and then (c) adjusting the concentration of the polymer composition or the interpenetrated polymer composition to be contained in the coating liquid into the amount as described above.

Furthermore, the coating liquid may include some amount of filler component such as a porous alumina, mica, kaolin and talc, which may be optionally added thereto.

Substrate Coated with a Silica-containing Film

The substrate coated with a silica-containing film according to the present invention can be obtained by (i) applying the above coating liquid onto the surfaces of any of various substrates, (ii) heating the thus-coated film and then (iii) decomposing or vaporizing the readily decomposable resin as a constituent part of the polymer composition or the interpenetrated polymer composition contained in the film.

The coating liquid can be applied onto the substrate by the use of any customary techniques such as the spray method, spin coating method, dip coating method, roll coating method and transfer printing method.

The temperature for heating the coated film is preferably in the range of 50 to 200° C., more preferably 80 to 150° C. Furthermore, it is preferable that the heating be conducted in an atmosphere of inert gas such as nitrogen for a period of 1 to 10 minutes, depending on the thickness of the coated film and properties of the coating liquid.

This heating not only promotes the polymerization of components contained in the coating liquid to thereby effect baking thereof but also lowers the melt viscosity of polymerized components to thereby increase the re-flow property of a silica-containing film with a low-dielectric constant with the result that the planarity of the thus-obtained silica-containing film is enhanced. The silica-containing film obtained from the coating liquid according to the present invention can maintain the re-flow property attributed to the low viscosity of the polymer component contained in the film up to about 150° C. Thus, a silica-containing film with highly enhanced planarity can be obtained.

Although it varies depending on the substrate to be coated and its target, the thickness of the silica-containing film with a low-dielectric constant formed in the above manner generally ranges from about 1000 to 2500 Å when forming on a silicon substrate of a semiconductor device and generally ranges from 3000 to 10,000 Å when forming between wiring layers of a multi-level interconnect.

Decomposition or vaporization of the readily decomposable resin as a constituent part of the polymer composition or the interpenetrated polymer composition contained in the film formed on the substrate is carried out by subjecting the substrate to a thermal treatment or to an irradiation with ultraviolet radiation, infrared radiation, electron beam, X-ray or oxygen plasma. The decomposition of the readily decomposable resin may be an oxidative decomposition and/or a thermal decomposition.

The thermal treatment is conducted at a temperature of not higher than 500° C. and also of not lower than the temperature at which the readily decomposable resin is vaporized or decomposed. However, the temperature of the thermal treatment will be higher than the above temperature for heating the coated film. The thermal treatment is preferably conducted for a period of 10 to 30 minutes, although it varies depending on the type of readily decomposable resin, thickness of the coated film, etc. When the temperature of the thermal treatment is conducted over 500° C., an aluminum wiring or copper wiring of a semiconductor substrate coated with the coating liquid may be oxidized or melted, thereby damaging the wiring layer. Therefore, the thermal treatment is to be conducted at a temperature of not higher than 500° C.

When the readily decomposable resin is oxidatively decomposed by the thermal treatment, it is preferable to conduct the thermal treatment in an atmosphere of oxygen-containing gas. If the readily decomposable resin is a volatile material, the thermal treatment can be conducted either in an atmosphere of oxygen-containing gas or in an atmosphere of inert gas such as nitrogen, as far as a temperature which can vaporize the readily decomposable resin is employed.

When the readily decomposable resin is decomposed by an irradiation with ultraviolet radiation, infrared radiation, electron beam, X-ray or oxygen plasma, the irradiation will be conducted at a dose required to decompose or vaporize the resin for a period of time sufficient thereto. For example, the irradiation with ultraviolet radiation is preferably conducted at a dose of 10,000 mJ, although it varies depending on the sort of readily decomposable resin, thickness of the coating film, etc.

By the above treatment, a silica-containing low-density film with a low-dielectric constant having essentially no pores or voids of more than 10 nm (100 Å) in diameter can be obtained. The thus-obtained film has characteristics in that soaking of etching gas components into the pores or voids at an etching stage and deterioration of the film quality attributed to the irradiation of oxygen plasma hardly take place and the film strength is very high.

For adding support to such characteristics, the size of pores and voids present in the low-density film are measured more accurately by means of SEM (scanning electron microscope) method and BJH (Barrett-Joyner-Helenda) method. As a result, a confirmation is made that:

(a) no pores or voids with a size of more than 10 nm in diameter are observed in the film, (b) pores or voids with an extremely small size which cannot be measured are likely to be formed in the film, and (c) an average diameter of pores or voids measured by the BJH method is not more than 10 nm, and especially is not more than 5 nm in the film with a higher mechanical strength than 70 MPa.

The above substrate coated with a silica-containing film with a low-dielectric constant according to the present invention is used in, for example, a semiconductor device, a liquid crystal display or a photomask with a phase shifter. Specifically, in the semiconductor device, the silica-containing film with a low-dielectric constant is formed, for example, on a silicon substrate, on a part between wiring layers of a multi-level interconnect, on an element surface or on a PN junction part.

A low-density insulating film having a dielectric constant as low as 3 or less and being excellent in etching performance can be obtained by use of the above coating liquid for forming a silica-containing film with a low-dielectric constant according to the present invention.

When a conventional coating liquid containing a hydrolyzate of alkoxysilane or halogenated silane or fine particles of silica as a film-forming component is used, a silica-containing film with a low-dielectric constant may be obtained with a decrease of the film density due to a reduced Si—O—Si crosslinkage caused by an existence of the functional group such as hydrogen atom, fluorine atom or organic group to be bonded to silicon atom (i.e., Si—H, Si—F or Si—R), or by intergranular voids formed between the fine particles of silica. However, the silica-containing film having a functional group exhibits poor plasma resistance. Therefore, deterioration of the film quality may be caused at the etching stage, and then the silica-containing film with a low-dielectric constant using the conventional coating liquid may become unstable. In addition, poor adhesion to a substrate surface may be observed in the film obtained from the conventional coating liquid.

In contrast, when a silica coating film with a low-dielectric constant is formed from the coating liquid according to the present invention, deterioration of the film quality attributed to the irradiation of oxygen plasma in the process of plasma etching or peeling of a resist material, and soaking of etching gas components into pores or voids at an etching stage are prevented.

That is, the present invention can provide a substrate coated with a silica-containing film which is a low-density film having a dielectric constant as low as 3 or less and being excellent not only in the resistance to oxygen plasma and process adaptation such as etching performance, but also in the adhesion of the film thereto and film strength.

EXAMPLES

The present invention is now illustrated with reference to the following Examples, but such examples in no way limit the scope of the invention.

Examples of Preparation

Preparation of Fine Particles of Silica (1) To a solution consisting of a mixture of 139.1 g of pure water and 169.9 g of methanol which is kept at 60° C., 2982.5 g of a water/methanol solution of tetraethoxysilane (Ethyl Silicate 28 produced by Tama Chemicals Co., Ltd.) which is a mixture of 2450 g of an aqueous methanol solution containing 1960 g of methanol (i.e., at the weight ratio of water/methanol being 2/8) and 532.5 g of tetraethoxysilane, and 596.4 g of a 0.25% aqueous ammonia by weight were simultaneously added under agitation for a period of 52 hours. Subsequently, the thus-obtained reaction products were aged at the same temperature for 3 hours in the mixed solution. Thereafter, unreacted tetraethoxysilane, methanol and ammonia were removed by ultrafiltration, followed by addition of pure water, to thereby effect its purification. Then, after the silica content was adjusted to 5% by weight, a polycondensation reaction was carried out in an autoclave kept at 300° C. for 10 hours. Thereafter, the mixture was purified with the use of amphoteric ion exchange resin (AG-501 produced by Bio-Rad). Thus, a dispersion liquid of the fine particles of silica having an average diameter of 30 nm was obtained.

(2) The concentration of the fine particles of silica dispersed in the liquid was adjusted to 5% by weight, and a ten-fold amount of MIBK (methylisobutylketone) was added to the liquid. Subsequently, a solvent replacement was carried out by means of a rotary evaporator so as to prepare an MIBK solution with a silica concentration of 5% by weight and a water concentration of 0.5% by weight.

Preparation of Coating Liquids (1) The thus-obtained MIBK solution containing the fine particles of silica was mixed with triethoxysilane and further mixed with an MIBK solution containing an acrylic resin, both being in a given ratio as shown in Table 1, to obtain 100 g of a mixed solution for each.

The number-average molecular weight of the acrylic resin used was 22,190 based on polystyrene.

Then 100 g of an aqueous solution of nitric acid with a concentration of 0.01% by weight were added at once to the mixed solution, and a hydrolysis reaction of the triethoxysilane was performed at a temperature of 20° C. for about 1 hour with agitating at 500 rpm. Thereafter, the organic phase (i.e., MIBK phase) was separated from the resulting solution and then subjected to a solvent replacement by means of a rotary evaporator to completely remove alcohol by-produced by the hydrolysis reaction and water (including nitric acid) contained therein. Subsequently, it was diluted with MIBK again. Thus, the coating liquids (1) to (7) for forming a silica-containing film, each having a silica concentration of 20% by weight, were prepared.

(2) Furthermore, a coating liquid (8), which is obtained by allowing fine particles of silica to react with a hydrolyzate of triethoxysilane, was prepared in accordance with the process disclosed in Example 1 of Japanese Patent Laid-Open Publication No. 9(1997)-315812, and a coating liquid (9), which is obtained by adding a gas-generating substance of 3,3'-dimethoxy-4,4'-diazidodiphenyl to an organic SOG material available from Hitachi Kasei K.K., was prepared in accordance with the process disclosed in Example 1 of Japanese Patent Laid-Open Publication No. 8(1996)-330300.

TABLE 1

| Coating Liquid | Weight ratio of: | |
| --- | --- | --- |
| | Silica Particles (X) to Alkoxysilane (Y) for preparation of Polysiloxane [X/Y] | Polysiloxane (X + Y) to Acrylic resin (Z) for preparation of Polymer Composition [(X + Y)/Z] |
| (1) | 2/98 | 70/30 |
| (2) | 5/95 | 70/30 |
| (3) | 8/92 | 70/30 |
| (4) | 5/95 | 90/10 |
| (5) | 5/95 | 50/50 |
| (6) | 5/95 | 40/60 |
| (7) | 15/85 | 70/30 |
| (8) | 90/10 | — |
| (9) | — | — |

Remarks: X represents the weight of fine particles of silica and Y represents the weight of the alkoxysilane use, both being in terms of $SiO_2$. Z represents the weight of an acrylic resin used.

Example 1

Substrate with a Silica-containing Film

Each of the coating liquids (1) to (7) was applied by an SOG coating method onto a test piece of silicon wafer (a semiconductor substrate) having a size of 6 inches and heated at 150° C. for 3 minutes in an atmosphere of nitrogen gas. Thereafter, a thermal treatment was conducted at 400° C. for 30 minutes in an atmosphere of oxygen-containing gas which is a nitrogen gas containing 5% by volume of oxygen to form a silica-containing film on the surfaces of the test pieces of silicon wafer.

Each of the resulting films was formed with a thickness of around 5000 Å.

To evaluate such films coated on the test pieces of silicon wafer, each of them was subjected to the following measurements:

(a) a dielectric constant to be measured by a mercury probe method for which a frequency of 1 MHz is used, (b) an amount of moisture adsorption into the film, to be measured by a TDS (thermal desorption mass spectroscopy) method after the film was subjected to an irradiation of oxygen plasma, (c) film strength to be measured by a Sebastian strength tester, and (d) an average diameter of pores or voids present in the film to be measured by BJH (Barrett-Joyner-Helenda) method.

The results are shown in Table 2.

Comparative Example 1

Substrate with a Silica-containing Film

By use of the coating liquids (8) and (9), each of the test pieces of silicon wafer (a semiconductor substrate) coated with a silica-containing film was prepared in the same manner as described in Example 1.

To evaluate it in a comparison, a dielectric constant, an amount of moisture adsorption into the film which was subjected to an irradiation of oxygen plasma, film strength and an average diameter of pores or voids present in the film were measured in the same manner as described in Example 1.

The results are shown in Table 3.

TABLE 2

(Examples)

| Coating Liquid | Dielectric Constant | Amount of moisture adsorption | Film strength (MPa) | Average diameter of pores or voids (nm) |
| --- | --- | --- | --- | --- |
| (1) | 2.2 | Small | 70 or more | 2.9 |
| (2) | 2.1 | Small | 70 or more | 3.0 |
| (3) | 2.3 | Small | 70 or more | 3.1 |
| (4) | 2.8 | Small | 70 or more | 2.1 |
| (5) | 1.9 | Small | 70 or more | 4.8 |
| (6) | 1.7 | Small | 20 | 7.0 |
| (7) | 2.3 | Small | 16 | 9.0 |

TABLE 3

(Comparative Examples)

| Coating Liquid | Dielectric Constant | Amount of moisture adsorption | Film strength (MPa) | Average diameter of pores or voids (nm) |
| --- | --- | --- | --- | --- |
| (8) | 2.1 | Large | 18 | 18 |
| (9) | 2.5 | Large | 21 | 15 |

As it is apparent from Table 2, the silica-containing films obtained from the coating liquids (1) to (5) exhibited a dielectric constant of not more than 3 and a considerably small amount of moisture adsorption into the films.

The coating liquid (6) comprising a polymer composition constituted with a relatively large amount of the readily decomposable resin was likely to form a silica-containing film having pores or voids with a relatively large size in diameter, whilst the coating liquid (7) comprising a polymer composition constituted with a polysiloxane prepared with a relatively large amount of the fine particles of silica was likely to form a silica-containing film having pores or voids with a relatively large size in diameter, and also having a bonding strength between the particles of polysiloxane contained therein being relatively low. Because of having such physical properties, the film strengths of the silica-containing films obtained from the coating liquids (6) and (7) were not so high. However, the amount of moisture adsorption into the films was very small.

In contrast, the silica-containing films obtained from the coating liquids (8) and (9) exhibited a considerably large amount of moisture adsorption into the films, although the dielectric constant thereof was not more than 3.

In the silica-containing films obtained from the coating liquids (1) to (5), pores or voids contained therein were measured by the BJH method. As a result, it was observed that such films have no pores or voids with a size of more than 10 nm in diameter, whilst in the silica-containing films obtained from the coating liquids (6) and (7), pores or voids with a size of more than 10 nm in diameter were slightly observed.

Furthermore, an average diameter of pores or voids present in each of the above silica-containing films was measured by the BJH method. As a result, it was observed that the average diameter of pores or voids present in the above silica-containing films having high film strength, which were obtained from the coating liquids (1) to (5), was not more than 5 nm.

From the above results, it has become clear that a substrate coated with a low-density film having a dielectric constant as low as 3 or less and being excellent in resistance to oxygen plasma, adhesion to a substrate, and film strength, can be provided with the coating liquid for forming a silica-containing film with a low-dielectric constant according to the present invention.

What is claimed is:

1. A substrate coated with a silica-containing film with a low-dielectric constant, which is a low-density film formed by:
   (a) applying onto a substrate the coating liquid for forming a silica-containing film with a low-dielectric constant comprising a polymer composition consisting essentially of (i) a polysiloxane and (ii) a readily decomposable resin,
   said polysiloxane being a reaction product between fine particles of silica and a hydrolyzate of at least one alkoxysilane represented by the following formula (I):

$$X_n Si(OR)_{4-n} \quad (I),$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; and n is an integer of 0 to 3;

(b) heating the thus-coated film; and then
   (c) decomposing or vaporizing the readily decomposable resin contained in the film by a heat treatment at a temperature of not higher than 500° C. or by irradiation with ultraviolet radiation, infrared radiation, electron beam, X-ray or oxygen plasma, wherein the average diameter of pores or voids present in the low density silica film is not more than 10 nm.

2. The substrate coated with a silica-containing film with a low-dielectric constant as claimed in claim 1, wherein the average diameter of pores or voids present in the low-density silica film is not more than 5 nm.

3. The substrate coated with a silica-containing film with a low-dielectric constant as claimed in claim 1, wherein the polymer composition is an interpenetrated polymer composition in which the polysiloxane and the readily decomposable resin are entangled in each other on the molecular chain level.

4. The substrate coated with a silica-containing film with a low-dielectric constant as claimed in claim 1, wherein the fine particles of silica are obtained by hydrolyzing at least one alkoxysilane represented by the formula (I), optionally followed by aging.

5. The substrate coated with a silica-containing film with a low-dielectric constant as claimed in claim 1, wherein the polysiloxane is obtained by allowing a hydrolyzate of at least one alkoxysilane represented by the formula (I) to react with the surfaces of the fine particles of silica.

6. The substrate coated with a silica-containing film with a low-dielectric constant as claimed in claim 1, wherein the readily decomposable resin is a resin which is decomposed or vaporized by heating at a temperature of not more than 500° C. or by irradiating with ultraviolet radiation, infrared radiation, electron beam, X-ray or oxygen plasma.

7. The substrate coated with a silica-containing film with a low-dielectric constant as claimed in claim 1, wherein the readily decomposable resin has a number-average molecular weight of 500 to 50,000 based on polystyrene.

8. The substrate coated with a silica-containing film with a low-dielectric constant as claimed in claim 1, wherein the polymer composition is obtained by performing a catalytic hydrolysis reaction of alkoxysilane in a solution comprising:
   (i) the fine particles of silica having an average particle diameter of 5 to 50 nm;
   (ii) at least one alkoxysilane represented by the above formula (I); and
   (iii) the readily decomposable resin dissolved in an organic solvent being insoluble in water,
   with addition thereto of water and an acid catalyst or an aqueous solution containing the acid catalyst.

9. The substrate coated with a silica-containing film with a low-dielectric constant as claimed in claim 1, wherein a weight ratio (A/B) of the polysiloxane (A), in terms of $SiO_2$, to the readily decomposable resin (B), both being a constituent part of the polymer composition, is in the range of 95/5 to 50/50.

10. The substrate coated with a silica-containing film with a low-dielectnc constant as claimed in claim 1, wherein a mixing ratio (A/B) by weight, in terms of $SiO_2$, of the fine particles of silica (A) to the alkoxysilane (B) represented by the formula (I), both being used for preparing the polysiloxane, is in the range of 1/99 to 10/90.

UNITED STATES PATENT AND TRADEMARK OFFICE
CERTIFICATE OF CORRECTION

PATENT NO.    : 6,893,726 B2
DATED         : May 17, 2005
INVENTOR(S)   : Nakashima et al.

It is certified that error appears in the above-identified patent and that said Letters Patent is hereby corrected as shown below:

Title page,
Item [56], References Cited, FOREIGN PATENT DOCUMENTS, after
"WO    97/35939        *       2/1997", insert the following:
-- JP    8-330300      12/1996
   JP    9-315812      01/1998 --.

Column 16,
Line 60, "a low -dielectnc" should read -- a low-dielectric --.

Signed and Sealed this

Eighth Day of November, 2005

JON W. DUDAS
*Director of the United States Patent and Trademark Office*